US012362902B2

United States Patent
Lu et al.

(10) Patent No.: US 12,362,902 B2
(45) Date of Patent: Jul. 15, 2025

(54) PHASE INTERPOLATOR (PI) WITH CLAMPING CIRCUIT TO LIMIT OPERATION TO RANGE HAVING OPTIMAL INTEGRAL NON-LINEARITY AND RELATED METHODS

(71) Applicant: Microsoft Technology Licensing, LLC, Redmond, WA (US)

(72) Inventors: Ping Lu, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/386,980

(22) Filed: Nov. 3, 2023

(65) Prior Publication Data

US 2025/0150253 A1    May 8, 2025

(51) Int. Cl.
| | |
|---|---|
| H04L 7/00 | (2006.01) |
| H04L 7/02 | (2006.01) |
| H04L 25/00 | (2006.01) |
| H04L 25/40 | (2006.01) |

(52) U.S. Cl.
CPC .................................... H04L 7/02 (2013.01)

(58) Field of Classification Search
CPC ......... H04L 7/02; H04L 7/0004; H04L 7/033; H03L 7/093; H03L 7/0816; G06F 1/12
USPC .......................... 375/371, 355, 373, 375, 376
See application file for complete search history.

(56) References Cited

U.S. PATENT DOCUMENTS

| | | |
|---|---|---|
| 6,380,774 B2 | 4/2002 | Saeki |
| 2005/0024117 A1 | 2/2005 | Kubo |
| 2010/0098203 A1 | 4/2010 | Chien |
| 2011/0255643 A1* | 10/2011 | Fu .......................... H03L 7/0816 375/371 |
| 2020/0195240 A1 | 6/2020 | Lim |
| 2022/0224318 A1* | 7/2022 | Son ........................... G06F 1/12 |
| 2023/0041998 A1 | 2/2023 | Chong |

(Continued)

OTHER PUBLICATIONS

International Search Report and Written Opinion received for PCT Application No. PCT/US2024/051689 (MS#413604-PCT01), Feb. 10, 2025, 15 pages.

(Continued)

*Primary Examiner* — Phuong Phu
(74) *Attorney, Agent, or Firm* — NovoTechIP International PLLC

(57) ABSTRACT

A phase-interpolator (PI) circuit generates an interpolated clock to capture data in a capture circuit at a target phase in a phase range between two reference clocks based on an interpolation code within a range of interpolation codes is described. A clamping circuit coupled to the PI circuit provides an interpolation code within a reduced range, where the integral non-linearity (INL) of the interpolated clocks is below a threshold, such that data capture based on the interpolated clock has a lower bit error rate (BER). As a result, the interpolated clock is generated within a reduced phase range corresponding to the reduced range of interpolation codes. When a target phase for an interpolated clock is outside the reduced phase range, the clamping circuit may adjust the target phase clock relative to a reference clock to adjust the target phase to be within the reduced phase range for improved BER.

25 Claims, 10 Drawing Sheets

(56) References Cited

U.S. PATENT DOCUMENTS

| | | | |
|---|---|---|---|
| 2023/0155595 A1* | 5/2023 | Huang | H03L 7/093 |
| | | | 375/376 |
| 2023/0344419 A1 | 10/2023 | Chaturvedi | |
| 2024/0121073 A1* | 4/2024 | Ye | H04L 7/033 |
| 2024/0348954 A1* | 10/2024 | Zhang | H04L 7/0004 |
| 2025/0167776 A1 | 5/2025 | Lu | |

OTHER PUBLICATIONS

International Search Report and Written Opinion received for PCT Application No. PCT/US2024/052174 (MS#413938-PCT01), Feb. 18, 2025, 17 pages.

Non-Final Office Action mailed on May 28, 2025, in U.S. Appl. No. 18/514,165, 19 pages.

* cited by examiner

PHASE INTERPOLATOR (PI) WITH CLAMPING CIRCUIT TO LIMIT OPERATION TO RANGE HAVING OPTIMAL INTEGRAL NON-LINEARITY AND RELATED METHODS

FIELD OF THE DISCLOSURE

The technology of the disclosure relates, in general, to phase interpolators (PIs) and, more particularly, to improving the linearity of phase interpolation.

BACKGROUND

In digital logic circuits, data may be transmitted from one sequential logic circuit (e.g., D Flip-Flop) to another through combinational logic in each cycle of a system clock signal. A receiving sequential logic circuit captures the data indicated by a voltage level on an input in the next clock cycle. If there is any variation in the period of the clock signal as a result of uncertainty (e.g., jitter), the signals may not have sufficient time to stabilize at the input of the next sequential logic circuit before the next clock signal. Thus, the clock used to capture the data needs to be synchronized to the data. The data stored in a sequential logic circuit may also be provided to circuits of other types but still require a clock signal that is synchronized to the data. In some cases, a clock signal is needed to capture data at an optimal time in each cycle. The optimal time can be at any phase of the system clock signal, not just at the rising edge that triggers the sequential logic circuit. To generate a clock signal at a precise phase, a phase interpolator may be used. A (phase interpolator) PI generates an interpolated clock in a phase range between two reference clocks having different phases (e.g., 0 degrees and 90 degrees), preferably dividing the phase range into equal increments and generating the interpolated clock at a closest increment. In such case, the difference between the optimal phase location and the closest increment may be less than half the width of the increment. However, phase-interpolators implemented in transistor circuits suffer from non-linearity, such that the divisions between phase increments may not be equal to each other, with some being too narrow and some too wide. Efforts to improve the linearity of a PI are ongoing.

SUMMARY

Exemplary aspects disclosed herein include a phase interpolator (PI) with a clamping circuit to adjust operation to a limited range of integral non-linearity. Related methods of adjusting a PI to a limited range of integral non-linearity are also disclosed. In a clamped PI circuit, a PI circuit generates an interpolated clock to capture data in a capture circuit at a target phase in a phase range between two reference clocks based on an interpolation code within a range of interpolation codes. The target phase of the interpolated clock may be indicated by a target phase clock. The interpolated clock is generated at one of a plurality of phase increments in the phase range closest to the target phase. A clamping circuit coupled to the PI circuit provides interpolation codes within a reduced range of interpolation codes, where the integral non-linearity (INL) of the interpolated clocks is below a threshold, such that data capture based on the interpolated clock has a lower bit error rate (BER). As a result, the interpolated clock is generated within a reduced phase range corresponding to the reduced range of interpolation codes. In some examples, when the target phase for an interpolated clock is outside the reduced phase range, the clamping circuit is configured to adjust the target phase clock relative to a reference clock to adjust the target phase to be within the reduced phase range for improved BER.

In one exemplary aspect, a clamped phase interpolator is disclosed. The clamped phase interpolator includes a phase interpolator configured to generate an interpolator clock having a first phase in a first phase range based on a first interpolation code in a first range of interpolation codes. The clamped phase interpolator also includes a clamping circuit configured to receive an indication of a reduced range of interpolation codes comprising less than all of the first range of interpolation codes, wherein the reduced range of interpolation codes corresponds to a reduced phase range comprising a portion of the first phase range and further configured to receive a target phase clock having a target phase; and provide, to the phase interpolator, the first interpolation code corresponding to the target phase in the reduced range of interpolation codes.

In another exemplary aspect, an integrated circuit (IC) is disclosed. The IC includes a sequential logic circuit configured to store data in response to a system clock, a capture circuit configured to, in each cycle of the system clock, receive the data from the sequential logic circuit in response to an interpolator clock, and a clamped phase interpolator. The clamped phase interpolator comprising a phase interpolator configured to generate the interpolator clock having a first phase in a first phase range based on a first interpolation code in a first range of interpolation codes; and a clamping circuit. The clamping circuit configured to receive an indication of a reduced range of interpolation codes comprising less than all of the first range of interpolation codes, wherein the reduced range of interpolation codes corresponds to a reduced phase range comprising a portion of the first phase range, receive a target phase clock having a target phase, and provide, to the phase interpolator, the first interpolation code corresponding to the target phase in the reduced range of interpolation codes.

In another exemplary aspect, a method in clamped phase interpolator is disclosed. The method includes generating an interpolator clock having an interpolator phase in a first phase range based on a first interpolation code in a first range of interpolation codes and receiving a target phase clock having a target phase. The method also includes receiving an indication of a reduced range of interpolation codes comprising less than all of the first range of interpolation codes, wherein the reduced range of interpolation codes corresponds to a reduced phase range comprising a portion of the first phase range and providing the first interpolation code corresponding to the target phase in the reduced range of interpolation codes.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 7:
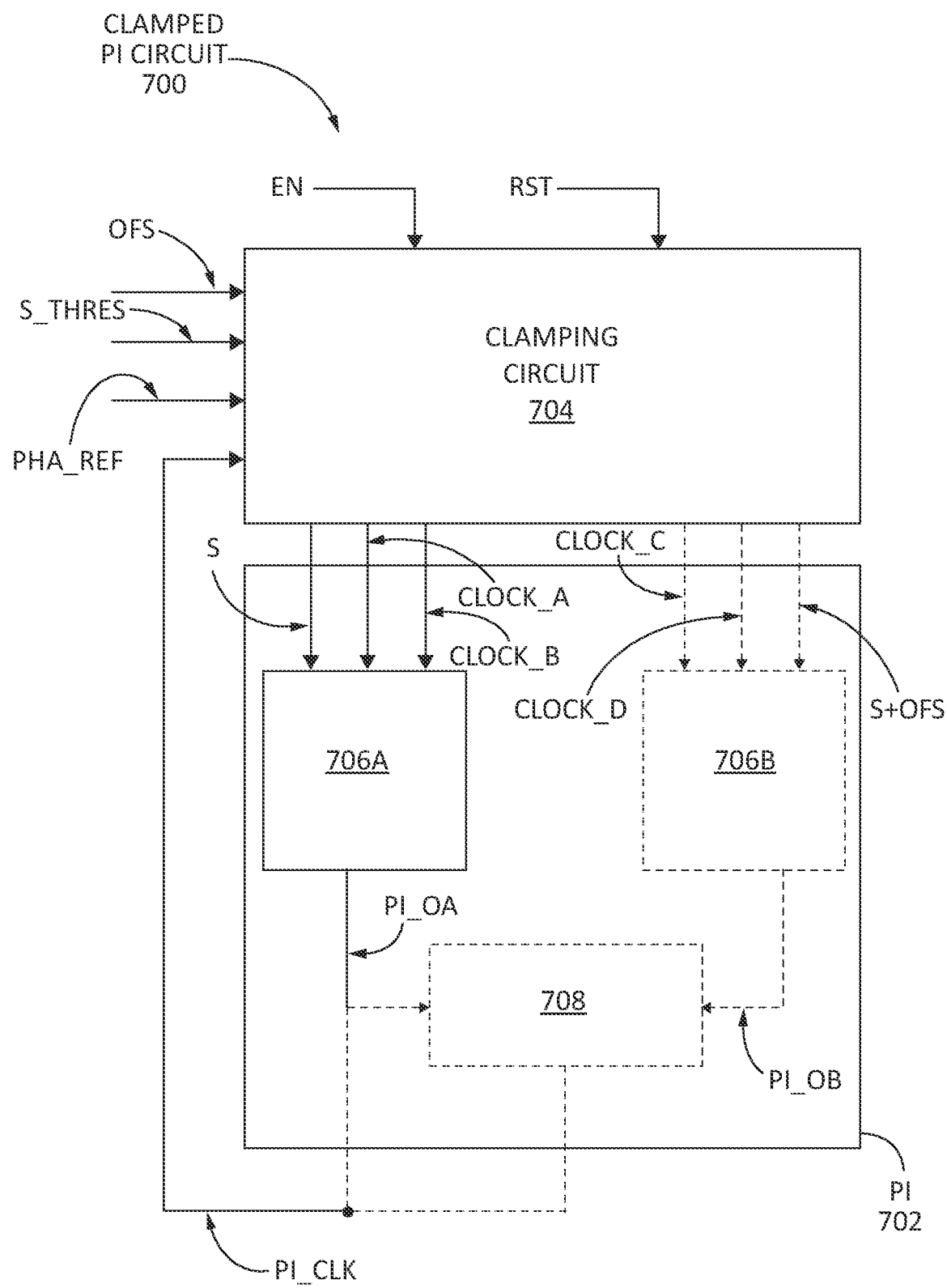
FIG. 7 is a schematic diagram of a clamped PI circuit, as shown in FIG. 6, including a clamping circuit and a PI, where the PI may comprise a single PI circuit or two PI circuits and a summing circuit.
Figure 9:
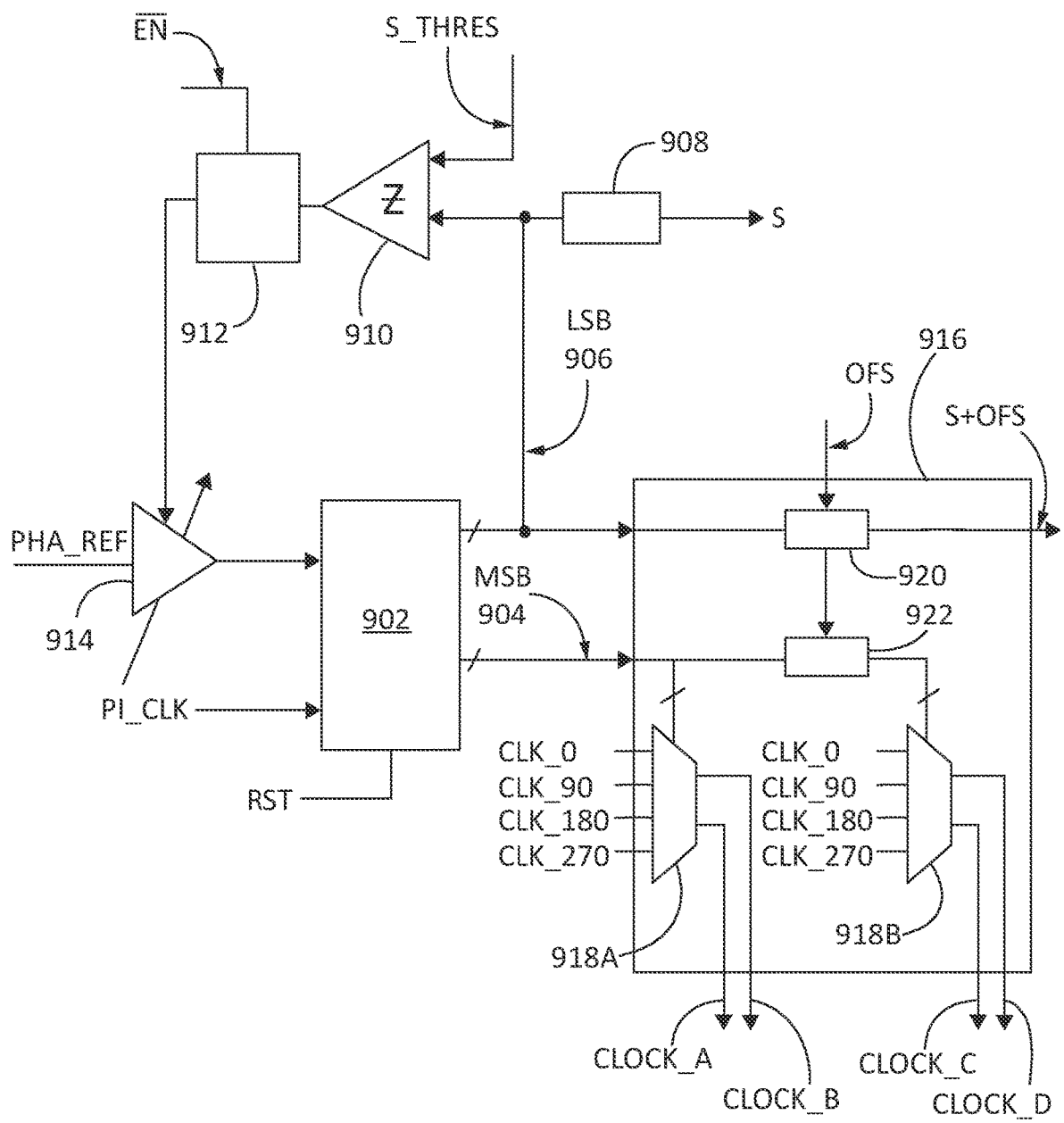
Figure 10:
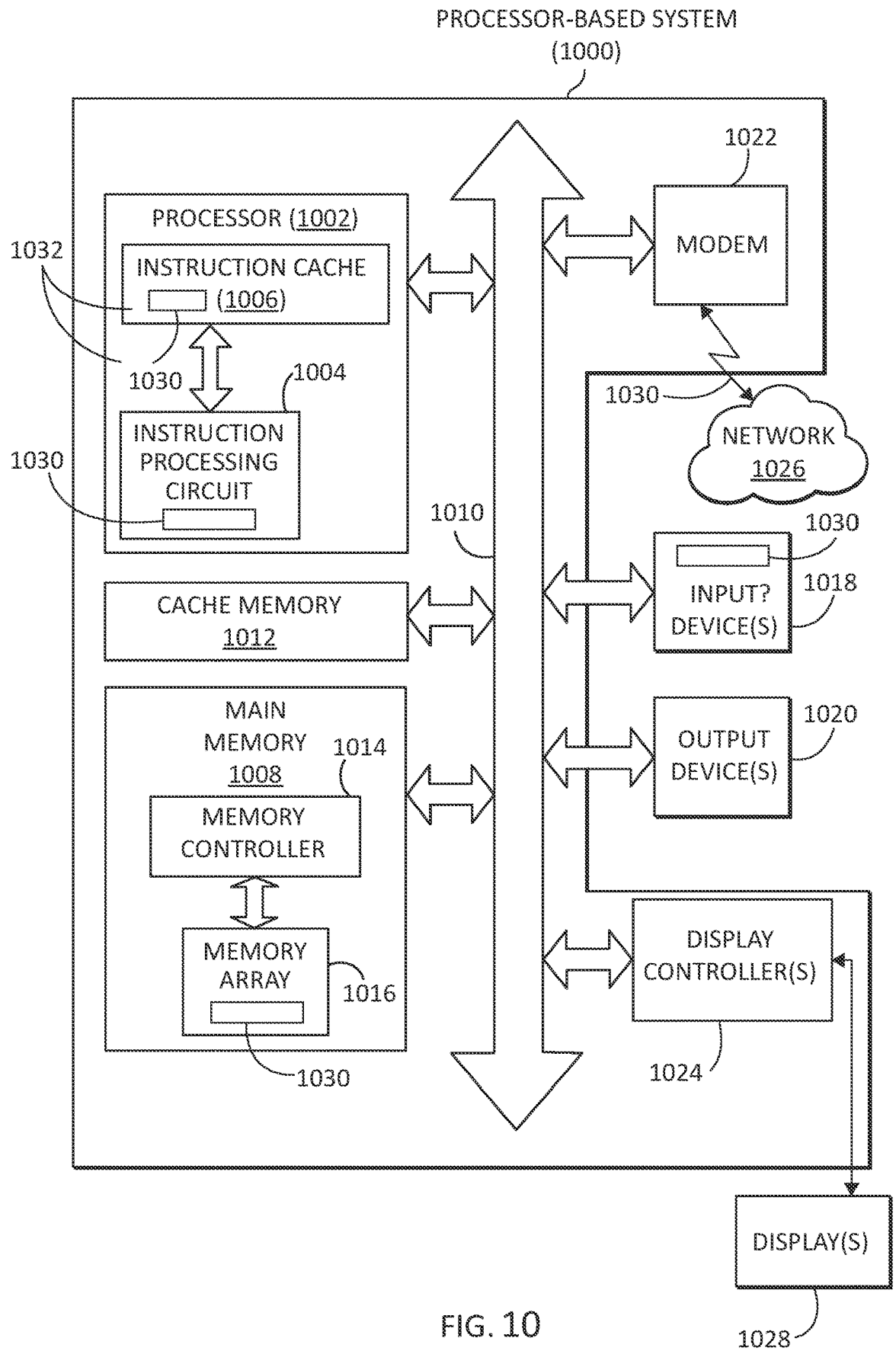

FIG. 9 is a schematic diagram of a clamping circuit, as shown in FIG. 7, for limiting a range of interpolation of a PI circuit to a reduced range corresponding to a reduced range of interpolation codes having INL below a threshold for reduce bit errors; and FIG. 10 is a block diagram of an exemplary processor-based system including a clamped PI circuit having a clamping circuit to limit a range of interpolation of a PI circuit to a reduced range corresponding to a reduce range of interpolation codes having INL below a threshold for reduce bit errors.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 1A:
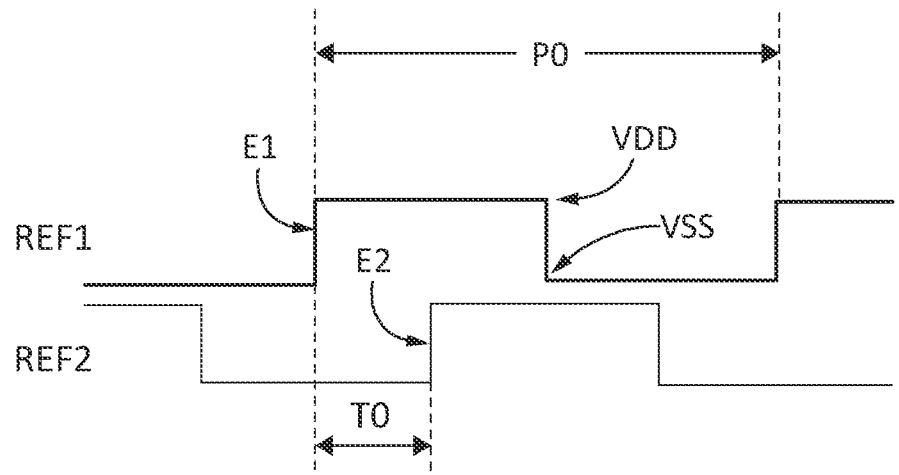
FIG. 1A is a timing diagram illustrating the ideal timing of a first reference clock and a second reference clock that may be employed in a phase interpolator to generate an interpolated clock having a target phase.

Exemplary aspects disclosed herein include a phase interpolator (PI) with a clamping circuit to adjust operation to a limited range of integral non-linearity. Related methods of adjusting a PI to a limited range of integral non-linearity are also disclosed. In a clamped PI circuit, a PI circuit generates an interpolated clock at one of a plurality of phase increments in a phase range between two reference clocks based on an interpolation code within a range of interpolation codes. The target phase of the interpolated clock may be indicated by a target phase clock. A clamping circuit coupled to the PI circuit provides interpolation codes within a reduced range of interpolation codes to the PI circuit, where the integral non-linearity (INL) of the interpolated clocks is below a threshold. As a result, the interpolated clock is generated within a reduced phase range corresponding to the reduced range of interpolation codes. In some examples, when a target phase for an interpolated clock is outside the reduced phase range, the clamping circuit is configured to adjust the target phase clock relative to a reference clock to adjust the target phase to be within the reduced phase range for a minimized bit error rate (BER). FIG. 1A is a timing diagram showing two reference clocks REF1 and REF2 having a same frequency but a difference in phase of 90 degrees. Herein, a phase may be indicated by a phase within a clock period at which there is a rising edge (step increase in voltage). In the time domain, a rising edge E1 of the reference clock REF1 precedes a rising edge E2 of the reference clock REF2 by a time period T0, where T0 is equal to one quarter (¼) of the cycle period P0 of the reference clocks REF1 and REF2. Thus, the reference clock REF1 is 90 degrees out of phase (ahead of) the reference clock REF2. The reference clocks REF1 and REF2 in FIG. 1A are shown with ideal (e.g., zero-time) transitions from a low voltage (e.g., VSS or 0 volts) to a high voltage (e.g., VDD) at rising edges E1 and E2. Thus, for one-quarter of the period P0, the reference clock REF1 is at the high voltage, and the reference clock REF2 is at the low voltage.

Figure 1B:
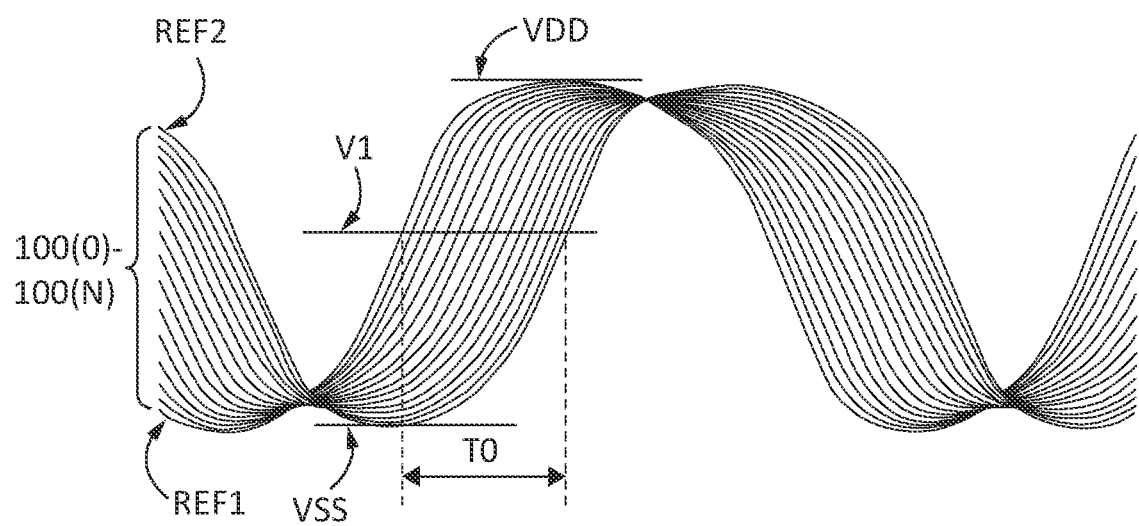
FIG. 1B is another timing diagram illustrating non-ideal timing of the first reference clock and the second reference clock and a plurality of interpolated clocks having phases between the first reference clock and the second reference clock and having equally divided phase increments between the reference clocks.

FIG. 1B is another timing diagram illustrating the first reference clock REF1 and the second reference clock REF2, with a more realistic (non-ideal) representation of timing, showing voltage steps from low to high and back to low over time. A time at which the reference clock REF1 crosses a threshold voltage V1 and a time at which the reference clock REF2 crosses the threshold voltage V1 are separated by the time T0.

The reference clocks REF1 and REF2 may be provided as system clocks to circuits that capture received data in response to a clock. Typically, neither the reference clock REF1 nor the reference clock REF2 arrives at a phase in the clock cycle that is optimal for capturing the data. For such situations, a PI circuit may be employed to generate an interpolated clock having a phase somewhere between reference clocks REF1 and REF2. A PI implemented as a digital transistor circuit may be configured to generate an interpolated clock at one of a plurality of incremental phases between the phases of the reference clock REF1 and the reference clock REF2. FIG. 1B shows interpolated clocks 100(0)-100(N) as generated in a digital PI circuit at phases that are equally, incrementally spaced between the reference clock REF1 and the reference clock REF2. In FIG. 1B, the time period T0 is equally divided into a number "N" of equal increments, each of duration T0/N.

If the optimal moment to capture data is somewhere between the reference clock REF1 and the reference clock REF2, a closest one of the interpolated clocks 100(0)-100(N) may be generated to capture the data. An interpolation code may be provided to the PI to select a closest one of the interpolated clocks 100(0)-100(N). With equal divisions, a difference between the optimal point and the closest one of the interpolated clocks 100(0)-100(N) will be less than or equal to half the duration T0/N (e.g., T0/2N). However, generating interpolated clocks 100(0)-100(N) having equally spaced phase differences can be very difficult, if not impossible, due to transistor non-linearity, as discussed further below. As a result, interpolated clocks generated in a CMOS PI may not be spaced apart by equal phase differences.

Figure 2A:
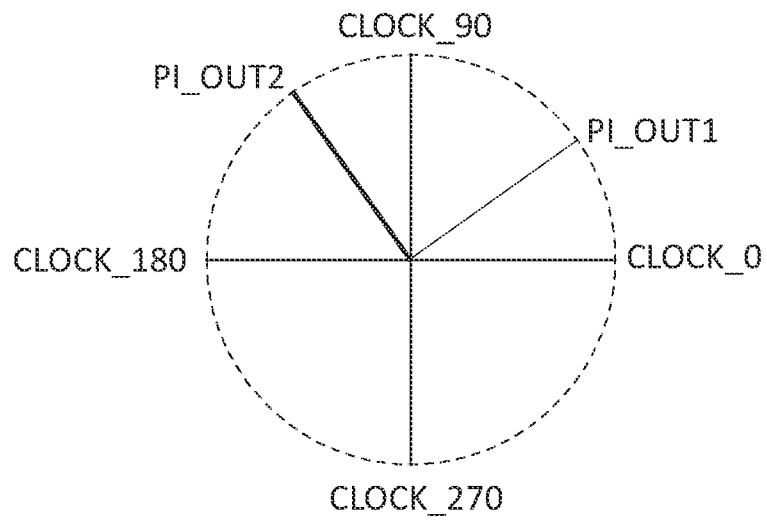
FIG. 2A is a radial diagram illustrating reference clocks having a same period but having respective phase differences of 90 degrees and FIG. 2B is a timing diagram illustrating the phase and phase differences of the reference clocks in the time domain.
Figure 2B:
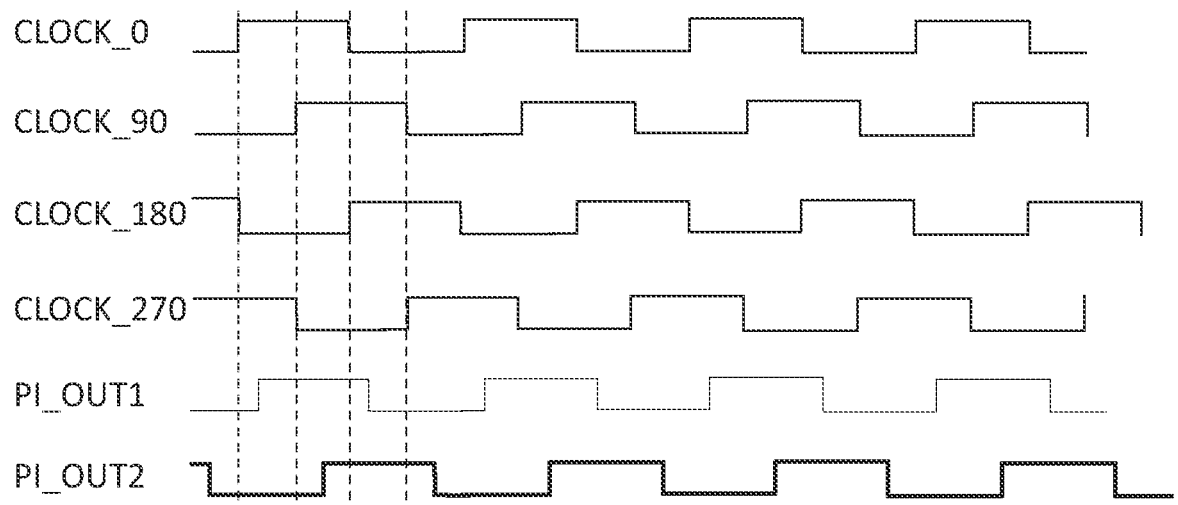

FIG. 2A is a radial diagram illustrating reference clocks clock_0, clock_90, clock_180, and clock_270, having the same frequency but spaced apart by 90 degrees. A PI circuit may generate an interpolated clock between any two adjacent reference clocks (e.g., spaced by 90 degrees). For example, in FIG. 2A, the interpolated clock PI_OUT1 may be generated by interpolation between the reference clocks clock_0 and clock_90, whereas the interpolated clock PI_OUT2 may be generated by interpolation between the reference clocks clock_90 and clock_180. The reference clocks clock_0, clock_90, clock_180, and clock_270 and the interpolated clocks PI_OUT1 and PI_OUT2 are illustrated in the time domain in FIG. 2B.

Figure 3A:
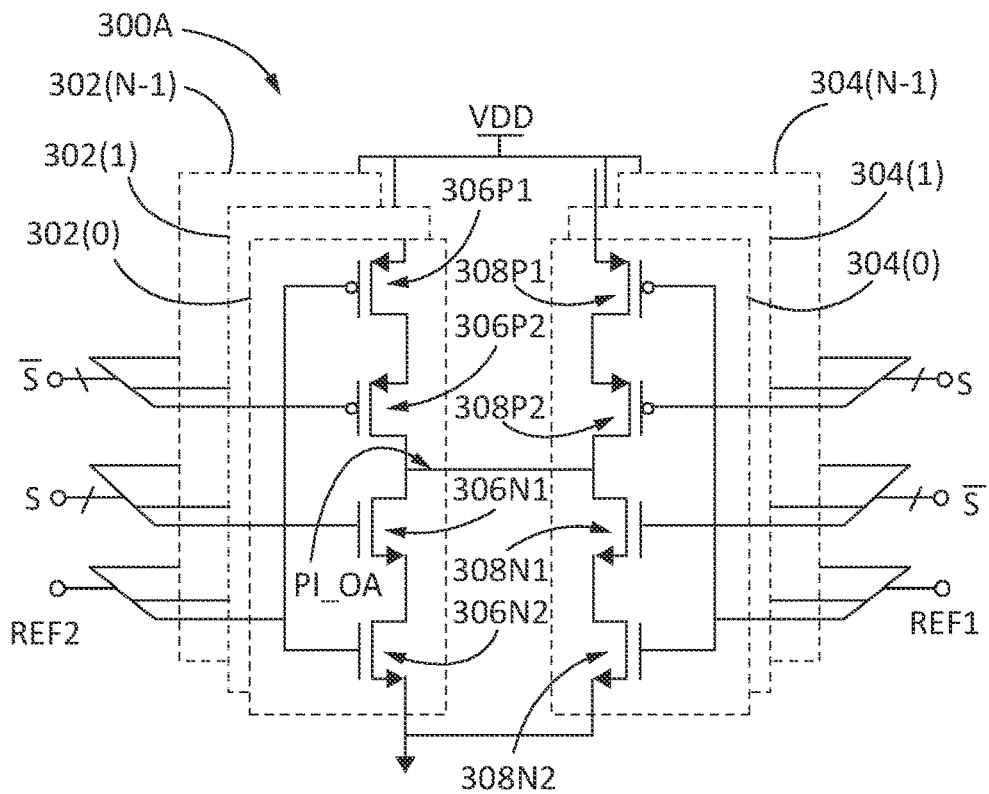
FIGS. 3A and 3B are schematic diagrams of phase interpolator (PI) circuits that may be employed independently or in a summing PI to generate interpolated clocks having improved integral non-linearity (INL)

FIG. 3A is a schematic diagram of a PI circuit 300A configured to generate interpolated clocks in the range between a first reference clock REF1 and a second reference clock REF2 with a phase separation in this example of 90 degrees, as shown in FIG. 1A through 2B. It should be understood that the PI circuit 300A is not limited to interpolating between reference clocks with a 90-degree separation. Thus, the phase separation between reference clocks REF1 and REF2 in this example may be more or less than 90 degrees. As PI circuit 300A is known to those of skill in the art, a detailed description of structural aspects and operation thereof are not provided herein, except as follows. First circuits 302(0)-302(N−1) and second circuits 304(0)-304(N−1) are activated by a digital interpolation code "S" having N digits. Each of the first circuits 302(0)-302(N−1) includes P-type transistors 306P1 and 306P2 and N-type transistors 306N1 and 306N2. Each of the second circuits 304(0)-304(N−1) includes P-type transistors 308P1 and 308P2 and N-type transistors 308N1 and 308N2. It is noted that N slices are adopted to generate N interpolated phases, which actually have N−1 phase spaces between them. The $N^{th}$ phase is usually to be generated by using reference clocks of next quadrant (e.g., clk_90 and clock_180 if the current inputs are clk_0 and clk_90) and the interpolation code 0.

Figure 3B:
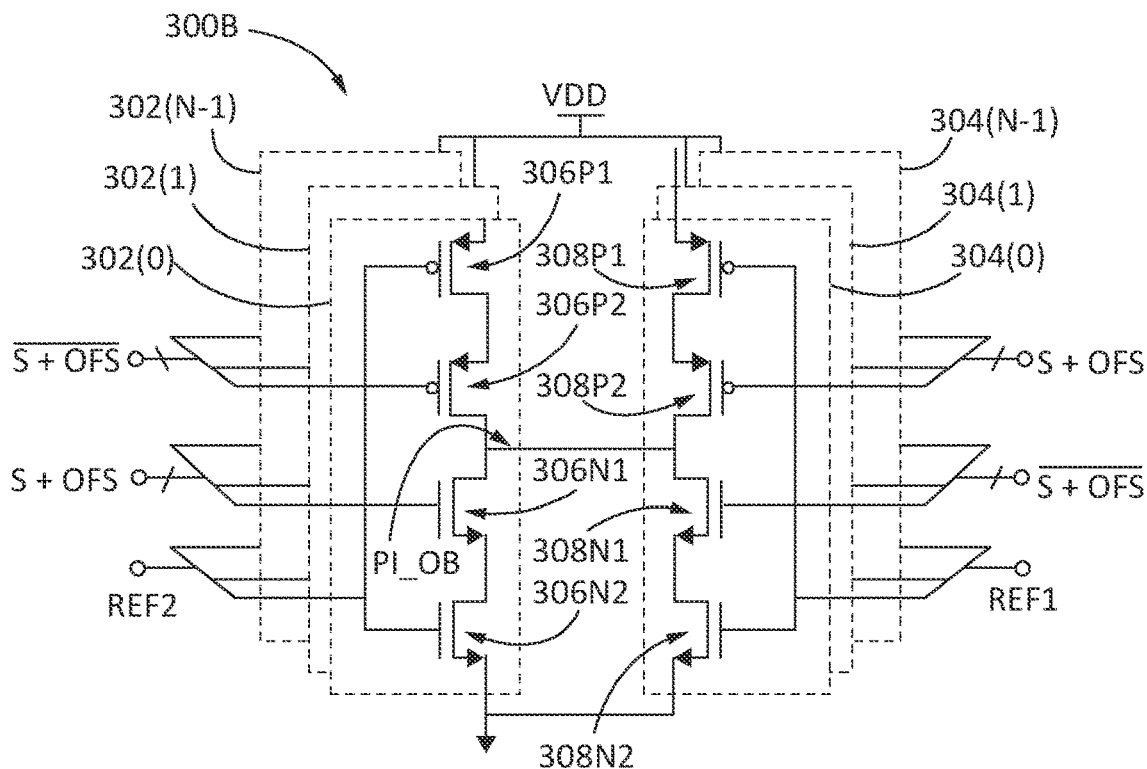

The first circuits 302(0)-302(N−1), pull the voltage of an interpolated clock PI_OA up or down in the PI circuit 300A based on the values of the reference clock REF1 and the interpolation code S (and the inverse of S, shown as interpolation code S_bar in FIGS. 3A and 3B). The second circuits 304(0)-304(N−1) pull the voltage of the interpolated clock PI_OA down or up based on the values of the reference clock REF2 and the interpolation code S. Thus, the first circuits 302(0)-302(N−1) and the second circuits 304 (0)-304(N−1) are pulling in opposite directions when the reference clock REF1 is high and the reference clock REF2 is low (e.g., between E1 and E2 in FIG. 1A). The numbers of "1s" and "0s" in the interpolation code S determine the numbers of the respective first circuits 302(0)-302(N−1) and second circuits 304(0)-304(N−1) and therefore determine the timing of the transition of the interpolated clock PI_OA. Ideally, as the number of "1s" in the interpolation code S changes, the phase of the interpolated clock PI_OA would shift by a phase difference corresponding to the time division T0/N In FIG. 1B. However, as noted above, the transistors switch non-linearly, creating unequal phase differences between the interpolated clocks among adjacent interpolation codes S. One measure of the non-linear behavior in the PI circuit 300A is known as integral non-linearity (INL).

Figure 4A:
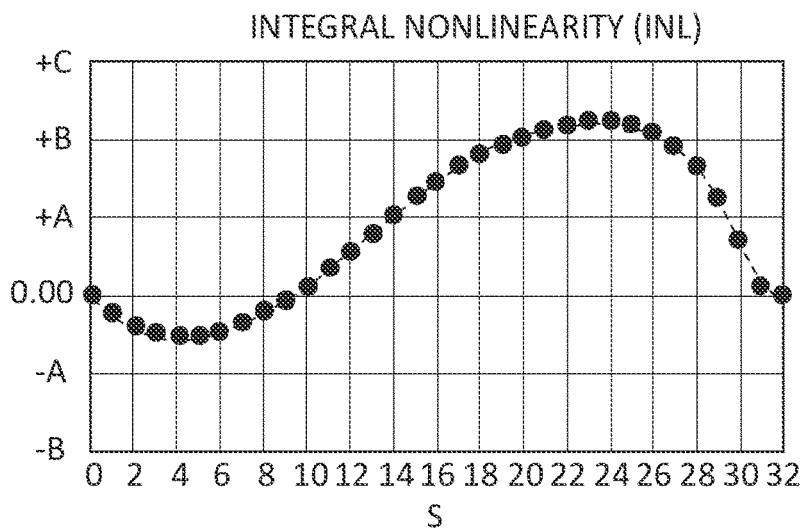
FIGS. 4A and 4B are graphical representations of the INL of the interpolated clock signals generated by the PI circuits in FIGS. 3A and 3B, respectively, in a range of interpolation codes.

Before describing FIG. 3B, FIG. 4A shows a graphical representation of the INL of the interpolator clock PI_OA in the PI circuit 300A at each of the phase increments corresponding to interpolation codes S from zero (0) to thirty-two (32). For each value of the interpolation code S (at each time increment), the INL in FIG. 4A is a difference between the time at which the output of an ideal interpolator clock PI_OA would reach a voltage threshold and a measured time. Ideally, the INL would be zero ("0") at all values of the interpolation code S. As the magnitude of this difference (the INL) increases, the ability to capture data at the optimal time decreases. At the smaller interpolation codes S (e.g., 0 to 10) in FIG. 4A, the interpolator clock PI_OA differences are negative, indicating that the timing differences of the interpolator clock PI_OA for each incremental interpolation code S are initially smaller than the ideal. The interpolator clock PI_OA differences then become positive, indicating that the timing differences are larger than the ideal. These differences, whether positive or negative, indicate unequal divisions of the 90-degree phase difference between the reference clocks REF1 and REF2 in FIG. 1B. Although the interpolation code S has thirty-two possible values in the examples described herein, there may be any appropriate integer number of interpolation codes S.

Figure 4B:
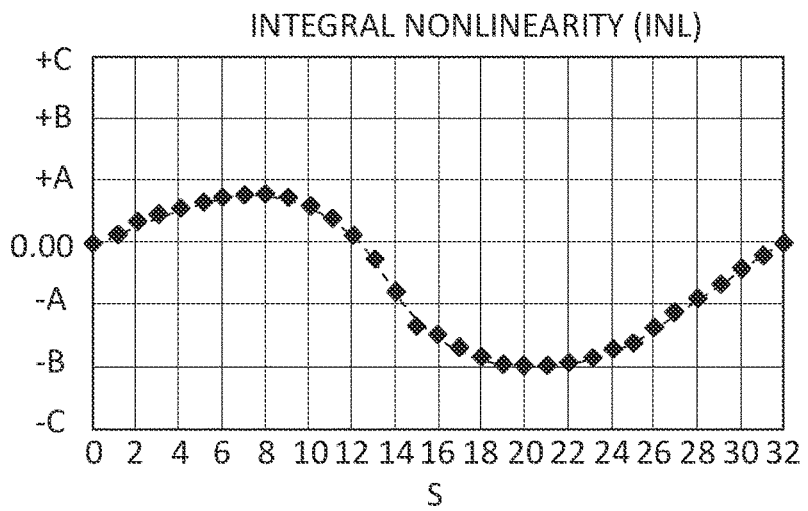

Improving the INLs across all interpolation codes S improves the timing of the clock for capturing data at any phase within the range of phase interpolation. One mechanism for improving the INLs compared to the PI circuit 300A in FIG. 3A is to also employ a second PI circuit 300B, as shown in FIG. 3B. The PI circuit 300B would operate identically to the PI circuit 300A to generate the interpolated clock PI_OB if the PI circuit 300B received the same interpolation code S. Instead, however, a different interpolation code T, which is a sum of the interpolation code S and an offset OFS (e.g., S+OFS), is provided to the PI circuit 300B. For example, when the interpolation code S equals zero ("0") and the offset OFS is set to ten ("10"), the interpolation code T equals ten ("10"). FIG. 4B is a graphical representation of the INL of the interpolator clock PI_OB in the PI circuit 300B from a minimum interpolation code (S=0) to a maximum interpolation code (S=32), which corresponds to interpolation code T in a range from (ten) 10 to forty-two (42). Where the sum of S+OFS is greater than 32, the interpolation code T is equal to the sum of S+OFS minus the maximum interpolation code (32) (e.g., S+OFS−32).

As shown, the interpolated clock generated by the PI circuit 300B based on the offset interpolation code T may have opposite INL to the interpolated clocks generated by the PI circuit 300A. For example, where the interpolation code S is five ("5") in FIG. 4A, the INL of the PI circuit 300A is negative, but the INL of the PI circuit 300B shown in FIG. 4B is positive.

Figure 4C:
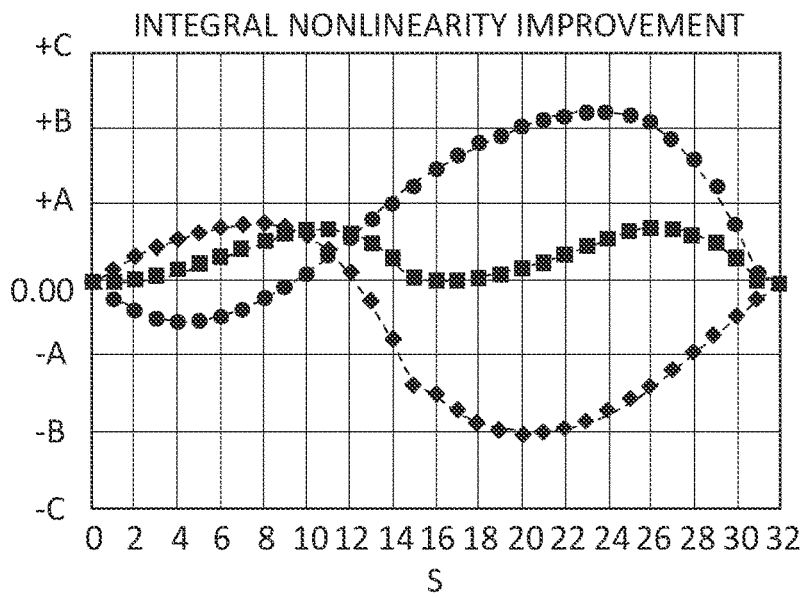
FIG. 4C is a graphical representation of the INL for the PI circuits in FIGS. 3A and 3B INL in addition to graphical representations of an interpolated clock generated by summing the interpolated clocks of the PI circuits in FIGS. 3A and 3B.

An offset OFS may be selected so that the polarities of the INLs of the PI circuit 300B shown in FIG. 4B are generally opposite to the INLs of the PI circuit 300A shown in FIG. 4A over the entire range of interpolation codes S. By summing the interpolated clocks from each of the PI circuits 300A and 300B, the resulting interpolated clock may have a significantly better INL than either of the PI circuits 300A and 300B. FIG. 4C shows, in a single graphic, the INLs 400A at each of the phase increments of the PI circuit 300A, the INLs 400B at each of the phase increments of the PI circuit 300B, and the INLs 400C at each of the phase increments of a summed interpolated clock PI_CLK formed by summing the interpolator clock PI_OA of the PI circuit 300A and the interpolator clock PI_OB of the PI circuit 300B. A PI configured in this manner is described in detail with regard to FIGS. 6 and 7. The INLs 400C of the summed interpolated clock PI_CLK are typically smaller in magnitude, in most cases over the entire range than either of the interpolated clocks PI_OA or PI_OB. However, in some portions of the entire interpolation code range (0-X), for example, the INLs 400C may still reach a higher-than-acceptable magnitude. The INLs 400C may be limited to a smaller value by limiting the interpolation codes S used for data capture to a preferred range (e.g., 0 to 7 or 15 to 23 in FIG. 4C) which corresponds to a portion of the phase range of the PI circuits 300A and 300B.

Figure 5A:
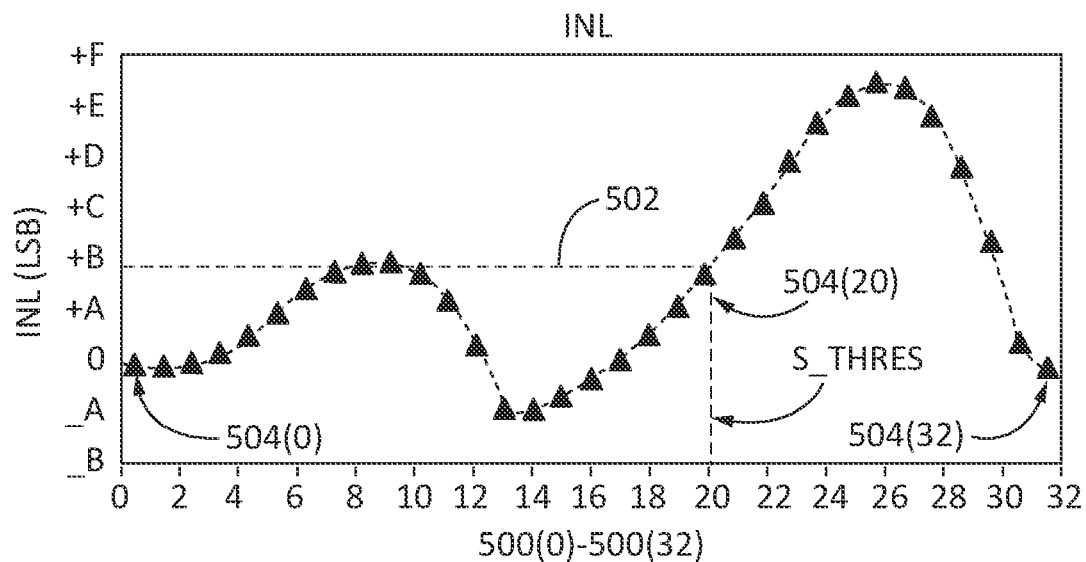
FIG. 5A is a second example of a graph of INLs of an interpolated clock identifying a reduced range of interpolation codes at which the INL of the interpolated clock is below an INL threshold and has a lower bit error rate (BER)

In this regard, FIG. 5A is a graph of interpolation codes 500(0)-500(X) and corresponding INLs 504(0)-504(X) (where X=32 in this example) of another example of an interpolation clock PI_CLK that may be the interpolated clock PI_OA of the PI circuit 300A or may be generated by summing the interpolated clock PI_OA of PI circuit 300A and the interpolated clock PI_OB of PI circuit 300B, as in FIG. 4C. The interpolation code S in FIGS. 3A and 3B may be any of the interpolation codes 500(0)-500(X). The example in FIG. 5A may be based on a different code offset OFS than in FIG. 4C. In this example, the INLs 504(0)-504 (2) are within a maximum acceptable INL magnitude (positive and negative), referred to as INL threshold 502. Above an interpolation code maximum 500(S_THRES) (also referred to herein as "S_THRES"), where S_THRES=20 in this example, the INL 504(21) is greater than the INL threshold 502, meaning that it is more likely that data captured by the interpolated clock PI_CLK (or PI_OA) will have errors due to the timing difference between the interpolated clock PI_CLK (or PI_OA) and the ideal phase increments. Using only the interpolation codes 500(0)-500 (20) for generating the interpolated clock PI_CLK achieves a reduced phase range RPR.

Figure 5B:
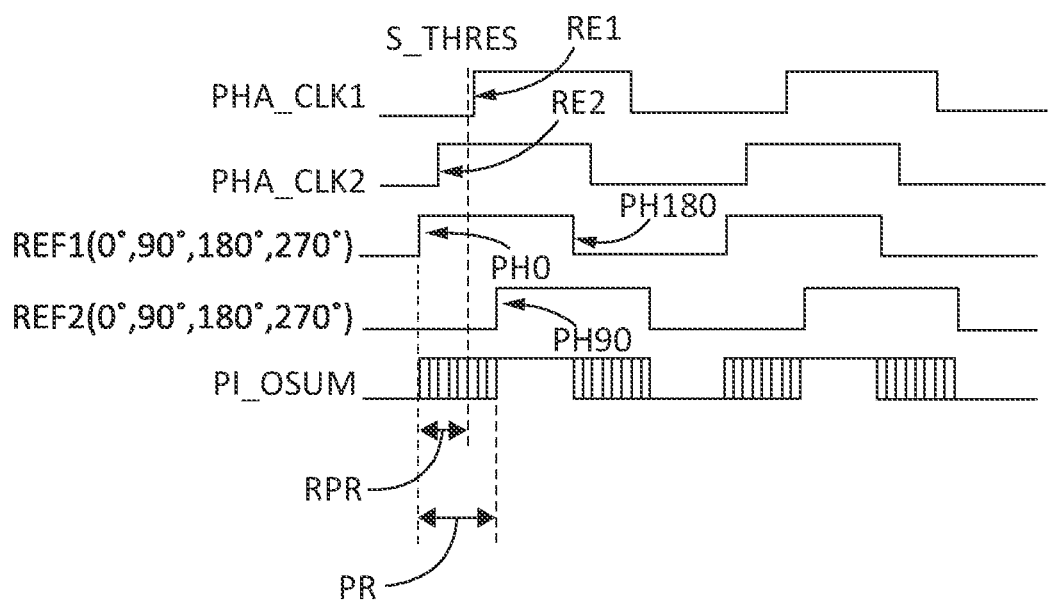
FIG. 5B is a timing diagram of two ideal reference clocks that may be employed to generate interpolated clocks in a 90-degree phase range and an indication of a reduced phase range corresponding to the reduced range of interpolation codes in FIG. 5A.

FIG. 5B is a timing diagram illustrating reference clocks REF1 and REF2 at references phases PH_0 and PH_90, having a 90-degree phase difference, as an example. The reference clocks REF1 and REF2 may be referred to as adjacent reference clocks. Similarly, reference clocks REF2 and REF3 (not shown) are adjacent reference clocks having rising edges at reference phases PH_90 and PH_180, respectively. FIG. 5B identifies the threshold S_THRES, which is a maximum interpolation code 500(S_THRES) (e.g., S_THRES=20) of a reduced range of interpolation codes 500(0)-500(S_THRES) where the INLs 504(0)-504 (S_THRES) are less than or equal to the INL threshold 502. FIG. 5B shows an ideal interpolated clock PI_O at equally spaced phase increments corresponding to the interpolation codes 500(0)-500(X) starting from interpolation code 500(0) up to interpolation code 500(20). FIG. 5B also includes a first example of a target phase clock PHA_CLK1 having a rising edge RE1 that is within the phase range between phases PH0 and PH90. However, the rising edge RE1 is not in the reduced phase range RPR corresponding to the reduced range of interpolation codes 500(0)-500 (S_THRES). Since it has been determined that most of the INLs 504(21)-504(32) exceed the INL threshold 502, where there is a higher BER, those codes are not to be used. In other words, in this example, it would require an interpolation code 500(S) greater than 20 (where S>S_THRES), where the BER may be unacceptable, to generate an interpolated clock at the rising edge RE1.

However, the timing of the target phase clock PHA_CLK1 relative to the reference clocks REF1 and REF2 may be adjusted. For example, the target phase clock PHA_CLK1 may be generated from a target phase reference PHA_REF (not shown) that is delayed by a first delay. In this regard, FIG. 5B shows a second example of a target phase clock PHA_CLK2 that may be generated from the target phase reference PHA_REF delayed by a second delay, shorter than the first delay. The phase of the (rising edge of the) adjusted target phase clock PHA_CLK2 is inside the reduced phase range RPR corresponding to the reduced range of interpolation codes 500(0)-500(20). Thus, by reducing the first delay that was used to produce the target phase clock PHA_CLK1 to the second delay that produced the target phase clock PHA_CLK2, it is possible to generate an interpolated clock PI_CLK based on one of the interpolation codes 500(S) within the reduced range RPR of interpolation codes 500(0)-500(S_THRES) where the INLs 504 (1)-504(20) are less than the INL threshold 502.

Figure 6:
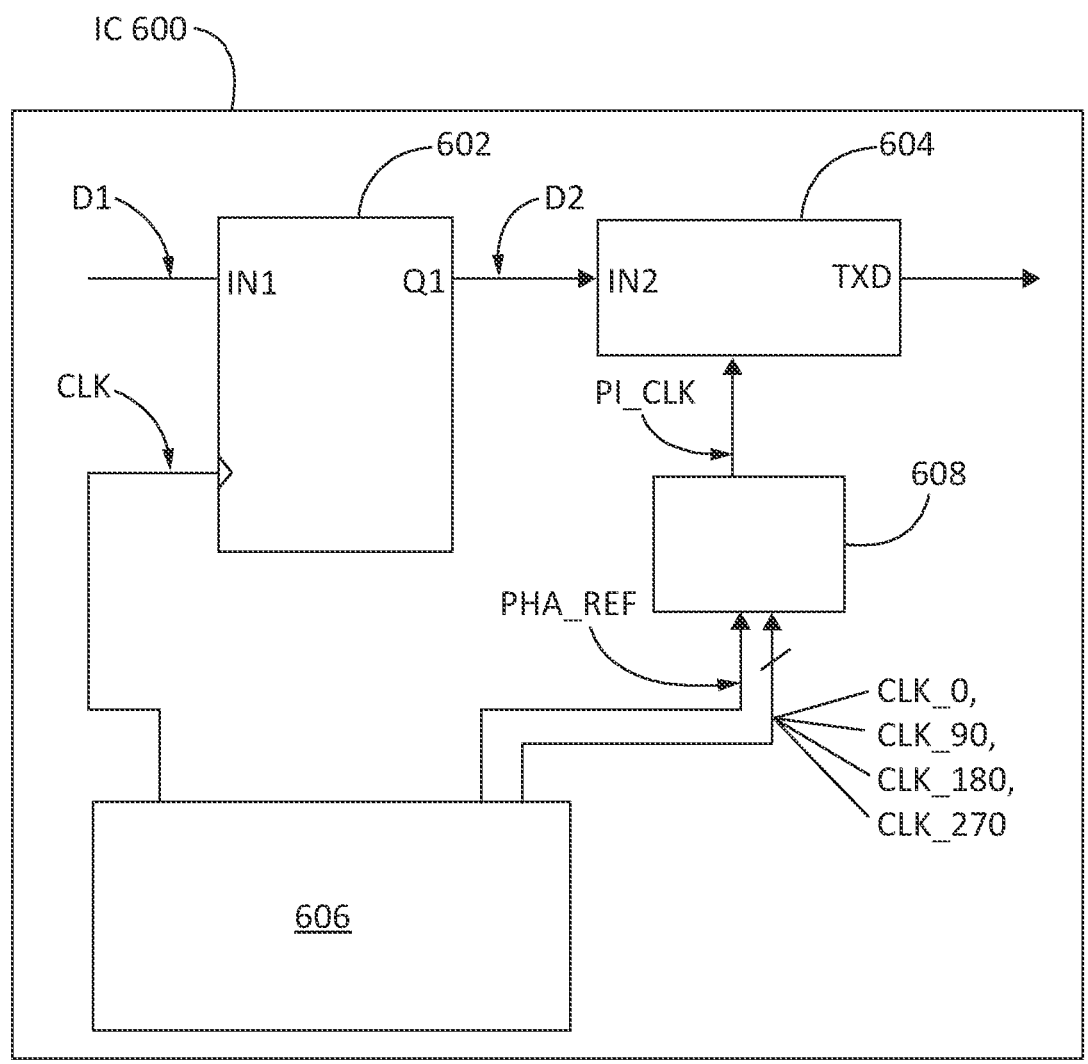
FIG. 6 is a schematic diagram of an IC 600, including a clamped PI circuit configured to provide an interpolated clock having a target phase within a reduced phase range to a capture circuit to capture data received from a sequential logic circuit.

FIG. 6 is a schematic diagram of an IC 600, including a sequential logic circuit 602 configured to receive and store data. The sequential logic circuit 602 receives data D1 at a data input IN1 and stores data D2 on an output Q1. In response to a transition (e.g., rising voltage) in every cycle of a system clock CLK, the data D1 is propagated through the sequential logic circuit 602 and stored on the output Q1 as data D2. The IC 600 also includes a capture circuit 604 that receives the data D2 on a data input IN2. The capture circuit 604 captures the data D2 and propagates the data D2 to an output TXD in response to an interpolated clock PI_CLK. The system clock CLK and the interpolated clock PI_CLK are periodic clocks operating at a same frequency F1. The interpolated clock PI_CLK may be timed to arrive at the capture circuit 604 at a clock phase corresponding to an optimal phase for capturing the data D2 on the data input IN2 with a minimum chance of error, for example. The system clock CLK is provided in this example by a clock circuit 606 on the IC 600. In some examples, the system clock CLK may be provided to the IC 600 from an external circuit. The interpolated clock PI_CLK is provided to the capture circuit 604 by a clamped phase interpolator (PI) circuit 608. The clamped PI circuit 608 receives reference clocks CLK_0, CLK_90, CLK_180, and CLK_270, which transition at respective reference phases PH_0, PH_90, PH_180, and PH_270 spaced apart at 90-degree phase intervals at the frequency F1. The clamped PI circuit 608 also receives a target phase clock PHA_REF indicating the target phase for capturing the data D2 at the data input IN2. The target phase is indicated by a transition of the target phase clock PHA_CLK, which may occur between the reference phase PH_0 of the reference clock CLK_0 and the reference phase PH_90 of the reference clock CLK_90, for example. The target phase may also be between the reference phase PH_90 of the reference clock CLK_90 and the reference phase PH_180 of the reference clock CLK_180, between the reference phase PH_180 of the reference clock CLK_180 and the reference phase PH_270 of the reference clock CLK_270, or between the reference phase PH_270 of the reference clock CLK_270 and the reference phase PH_0 of the reference clock CLK_0.

The transition of the target phase clock PHA_CLK is not used directly to capture the data D2 at the capture circuit 604 but indicates the timing at which such capture should occur. The clamped PI circuit 608 is configured to generate the interpolated clock PI_CLK as close to the phase of the target phase clock PHA_CLK as possible by interpolating between two adjacent reference clocks. The term "adjacent reference clocks" in this context refers to any two of the reference clocks CLK_0, CLK_90, CLK_180, and CLK_270 having the reference phases PH_0, PH_90, PH_180, and PH_270 separated by 90 degrees, such as reference clock CLK_0 and reference clock CLK_90. As described above, in an ideal PI circuit, a clock may be interpolated at any of a plurality of phases based on an interpolated code. The plurality of phases is separated by equal phase increments, and a closest one of the interpolated phases to the target phase of clock PHA_CLK is generated as the interpolated clock PI_CLK.

FIG. 7 is a schematic diagram of a clamped PI circuit ("clamped PI") 700, including a PI 702 and a clamping circuit 704. The PI 702 may be configured as a single PI circuit 706A generating the interpolated clock PI_CLK based on an interpolation code S. Alternatively, the PI 702 may be configured to also a second PI circuit 706B and a summing circuit 708. The PI circuits 706A and 706B may be the PI circuits 300A and 300B in FIGS. 3A and 3B. In this alternative, the PI circuit 706A receives an interpolation code S from the clamping circuit 704 and the PI circuit 706B receives an interpolation code S+OFS which is equal to the interpolation code S plus an offset OFS. The offset OFS is also provided to the clamping circuit 704. The PI circuit 706A receives two adjacent reference clocks CLOCK_A and CLOCK_B. The PI circuit 706B receives two adjacent reference clocks CLOCK_C and CLOCK_D. The reference clocks CLOCK_A through CLOCK_D may be selected from among a plurality of reference clocks by the clamping circuit 704. The reference clock CLOCK_C may be the reference clock CLOCK_A or the reference clock CLOCK_B. For example, the reference clocks CLK_0 and CLK_90 described in reference to FIG. 6 may be provided as the reference clocks CLOCK_A and CLOCK_B. In such example, the reference clock CLOCK_C may be either the reference clock CLK_0 at reference phase PH_0 or the reference clock CLK_90 at reference phase PH_90 and the reference clock CLOCK_D would be either the reference clock CLK_90 at the reference phase PH_90 or the reference clock CLK_180 at the reference phase PH_180.

The clamping circuit 704 also receives an indication S_THRES of a reduced range of the interpolation codes S where the interpolated clock PI_CLK has an INL below an INL threshold, as discussed above. The clamping circuit 704 also receives the target phase clock PHA_CLK. The interpolated clock PI_CLK, generated by either the PI circuit 706A or by the summing circuit 708, is provided to the capture circuit 604 in FIG. 6 and also provided as feedback to the clamping circuit 704. Additionally, the clamping circuit 704 also receives control signals EN and RST for enabling and resetting portions of the clamping circuit 704.

Figure 8:
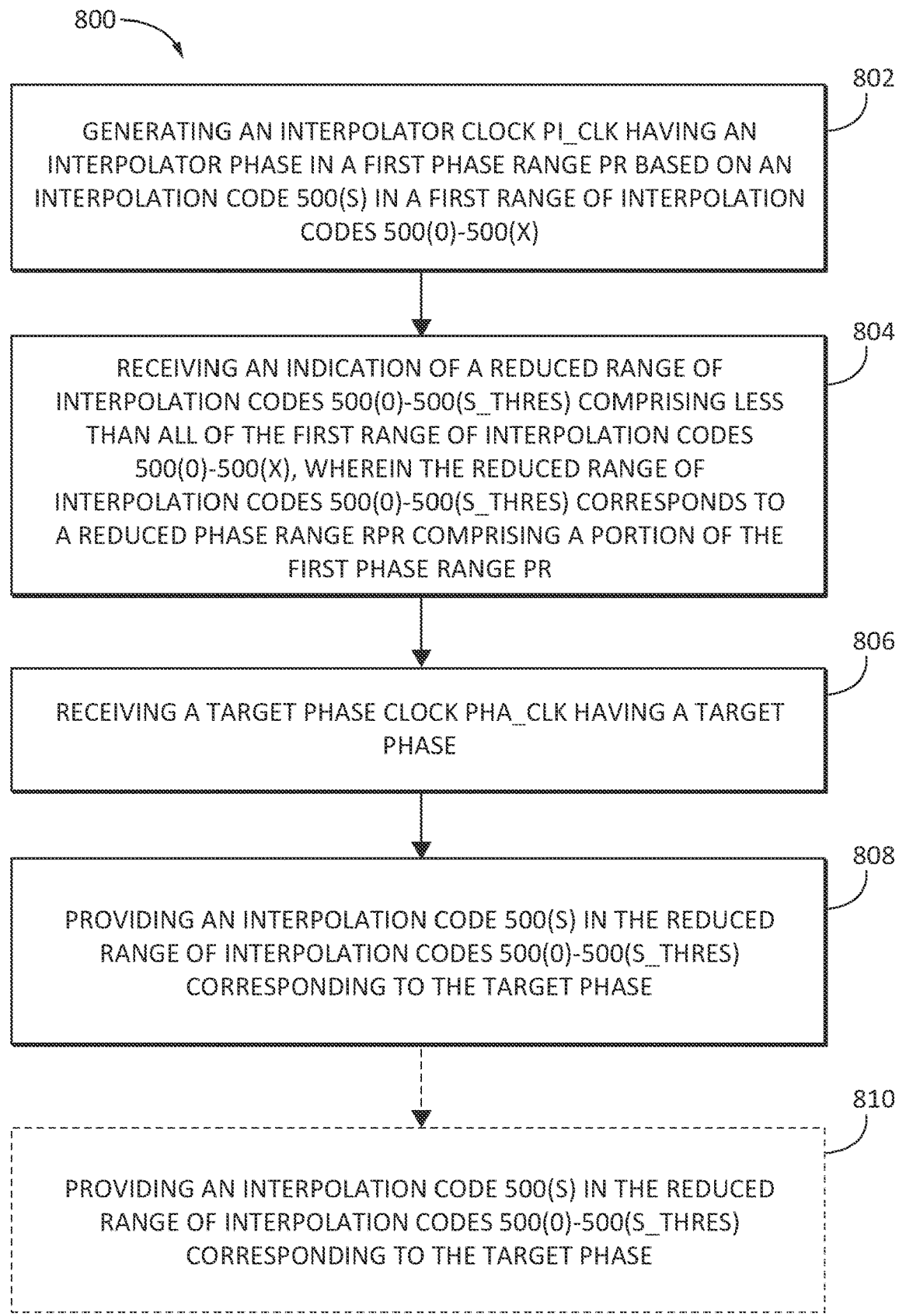
FIG. 8 is a flow chart illustrating a method in a clamped PI circuit configured to interpolate clocks in a reduced phase range corresponding to a reduced range of interpolation codes to reduce bit errors.

FIG. 8 is a flowchart illustrating a method 800 in a clamped phase interpolator. The method 800 includes generating an interpolator clock PI_CLK having an interpolator phase in a first phase range based on an interpolation code 500(S) in a first range of interpolation codes 500(0)-500(X) (block 802). The method includes receiving an indication of a reduced range of interpolation codes 500(0)-500(S_THRES) comprising less than all of the first range of interpolation codes 500(0)-500(X), wherein the reduced range of interpolation codes 500(0)-500(S_THRES) corresponds to a reduced phase range RPR comprising a portion of the first phase range (block 804). The method 800 includes receiving a target phase clock PHA_CLK having a target phase (block 806) and providing an interpolation code in the reduced range of interpolation codes 500(0)-500(S_THRES) corresponding to the target phase (block 808). Optionally, the method 800 may also include adjusting the target phase of the target phase clock PHA_CLK relative to a first reference clock CLOCK_A to be within the reduced phase range RPR (block 810).

FIG. 9 is a schematic diagram of a clamping circuit 900, which may be the clamping circuit 704 in FIG. 7. The description below of the clamping circuit 900 in FIG. 9 also includes references to features of FIG. 7. The clamping circuit 900 receives the summed interpolated clock PI_CLK generated in the PI 702 in FIG. 7 and the target phase reference PHA_REF. The clamping circuit 900 includes a phase detector 902 that compares phases of the summed interpolated clock PI_CLK and the target phase reference PHA_REF and generates a phase difference S_BIN which is a multi-bit value. The phase detector 902 incrementally increases or decreases the phase difference S_BIN. The phase difference S_BIN may be reset to an initial value by the reset signal RST.

The phase difference S_BIN includes more significant bits (MSBs) 904 and less significant bits (LSBs) 906. The LSBs 906 change in response to changes in the phase differences detected by the phase detector 902. Thus, a change in the LSBs 906 adjusts the phase of the interpolated clock PI_CLK.

The clamping circuit 900 receives an indication S_THRES of the reduced range of interpolation codes 500(0)-500(S_THRES). In the example described with reference to FIG. 5B, where the range of interpolation codes employed in a PI circuit (e.g., PI 702 in FIG. 7) may extend from a minimum interpolation code 500(0) of zero (0) to a first maximum interpolation code 500(X) of thirty-two (32), in this example, the indication S_THRES of twenty (20) indicates that the reduced range of interpolation codes extends from a minimum interpolation code of zero (0) to a second maximum interpolation code of twenty (20). To convert the interpolation codes S to a form usable in the PI 702, which comprises the PI circuits 300A and 300B in FIGS. 3A and 3B, the clamping circuit 900 includes a binary to thermometer decoder 908. The decoder 908 receives the LSBs 906, generates the interpolation codes 500(0)-500(S_THRES) described with reference to FIGS. 5A and 5B, and provides the interpolation codes 500(0)-500(S_THRES) to the PI 702.

The LSBs 906 identify an interpolation code that would be needed to set the phase of the interpolated clock PI_CLK to the target phase indicated by the target phase clock PHA_CLK. A comparator 910 compares the LSBs 906 to the indication S_THRES to determine whether the interpolation code S generated by the phase detector 902 is outside the reduced range of interpolation codes indicated by the indication S_THRES. If the determined interpolation code is outside the reduced range of interpolation codes (e.g., 500(0)-500(X)), a delay setting 912 may be adjusted to adjust a phase difference between the target phase of the target phase clock PHA_CLK and the interpolator phase of the PI_CLK. The delay setting 912 is activated by the enable signal EN. The delay setting 912 controls a delay circuit 914 that receives a target phase reference PHA_REF and generates the target phase clock PHA_CLK. In this regard, the delay circuit 914 may be employed to adjust the target phase of the target phase clock PHA_CLK relative to a first reference clock CLOCK_A to be within the reduced phase range that corresponds to the reduced range of interpolation codes S. Alternatively, the delay setting 912 may be employed to adjust a delay of delay circuits that provide the reference clocks CLOCK_A, CLOCK_B, CLOCK_C, and CLOCK_D to adjust the target phase of the target phase clock PHA_CLK relative to a first reference clock CLOCK_A.

If the LSBs 906 indicate an interpolation code 500(S) less than the indication S_THRES, the target phase of the target phase clock PHA_CLK is within the reduced phase range corresponding to the reduced range of interpolation codes (e.g., 500(0)-500(S_THRES)), which further indicates that the target phase of the target phase clock PHA_CLK is between a phase of the reference clock CLOCK_A and a phase of reference clock CLOCK_B.

In some examples, due to the code offset OFS employed in the clamping circuit 900, the first PI circuit 706A may receive the reference clock CLK_0 as the reference CLOCK_A and the reference clock CLK_90 as the reference CLOCK_B and the second PI circuit 706B may receive the reference clock CLK_90 as the reference CLOCK_C and the reference clock CLK_180 as the reference clock CLOCK_D. Such examples may occur because a first portion of the reduced phase range is between the reference phase PH_0 and the reference phase PH_90, and a second portion of the reduced reference phase is between the reference phase PH_90 and the reference phase PH_180. In this regard, the clamping circuit 900 includes a selection circuit 916, including selectors 918A and 918B, to select one of the reference clocks CLK_0, CLK_90, CLK_180, and CLK_270 as the reference clocks CLOCK_A, CLOCK_B, CLOCK_C, and CLOCK_D. Each of the PI circuits 706A and 706B receives two adjacent reference clocks (i.e., having a 90-degree phase separation). The selectors 918A and 918B are controlled by the MSBs 904 generated in the phase detector 902. In particular, the selector 918A may be controlled directly by the MSBs 904 and the selector 918B may be controlled by the MSBs 904 as modified by the code offset OFS. In the selection circuit 916, a calculation circuit 920 determines the interpolation codes S+OFS based on the code offset OFS and the LSBs 906. A modulus calculation block 922 controls the selector 918B based on the code offset OFS, the LSBs 906, and the MSBs 904.

FIG. 10 is a block diagram of an exemplary processor-based system 1000 that includes a processor 1002 (e.g., a microprocessor), including an instruction processing circuit 1004. The processor-based system 1000 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 1000 includes the processor 1002. The processor 1002 represents one or more general-purpose processing circuits, such as a microprocessor, central processing unit, or the like. More particularly, the processor 1002 may be an EDGE instruction set microprocessor or other processor implementing an instruction set that supports explicit consumer naming for communicating produced values resulting from execution of producer instructions. The processor 1002 is configured to execute processing logic in instructions for performing the operations and steps discussed herein. In this example, the processor 1002 includes an instruction cache 1006 for temporary, fast access memory storage of instructions accessible by the instruction processing circuit 1004. Fetched or prefetched instructions from a memory, such as a main memory 1008, over a system bus 1010, are stored in the instruction cache 1006. Data may be stored in a cache memory 1012 coupled to the system bus 1010 for low-latency access by the processor 1002. The instruction processing circuit 1004 is configured to process instructions fetched into the instruction cache 1006 and process the instructions for execution.

The processor 1002 and the main memory 1008 are coupled to the system bus 1010 and can intercouple peripheral devices included in the processor-based system 1000. As is well known, the processor 1002 communicates with these other devices by exchanging address, control, and data information over the system bus 1010. For example, the processor 1002 can communicate bus transaction requests to a memory controller 1014 in the main memory 1008 as an example of a slave device. Although not illustrated in FIG. 10, multiple system buses 1010 could be provided; wherein each system bus 1010 constitutes a different fabric. In this example, the memory controller 1014 is configured to provide memory access requests to a memory array 1016 in the main memory 1008. The memory array 1016 is comprised of an array of storage bit cells for storing data. The main memory 1008 may be a read-only memory (ROM), flash memory, dynamic random-access memory (DRAM), such as synchronous DRAM (SDRAM), etc. and/or static memory (e.g., flash memory, SRAM, etc.), as non-limiting examples.

Other devices can be connected to the system bus 1010. As illustrated in FIG. 10, these devices can include the main memory 1008, one or more input device(s) 1018, one or more output device(s) 1020, a modem 1022, and one or more display controllers 1024, as examples. The input device(s) 1018 can include any type of input device, including but not limited to input keys, switches, voice processors, etc. The output device(s) 1020 can include any type of output device, including but not limited to audio, video, other visual indicators, etc. The modem 1022 can be any device configured to allow an exchange of data to and from a network 1026. The network 1026 can be any type of network, including but not limited to a wired or wireless network, a private or public network, a local area network (LAN), a wireless local area network (WLAN), a wide area network (WAN), a BLUETOOTH™ network, and the Internet. The modem 1022 can be configured to support any type of communications protocol desired. The processor 1002 may also be configured to access the display controller(s) 1024 over the system bus 1010 to control information sent to one or more displays 1028. The display(s) 1028 can include any type of display, including but not limited to a cathode ray tube (CRT), a liquid crystal display (LCD), a plasma display, etc.

The processor-based system 1000 in FIG. 10 may include a set of instructions 1030 to be executed by the processor 1002 for any application desired according to the instructions. The instructions 1030 may be stored in the main memory 1008, processor 1002, and/or instruction cache 1006 as examples of a non-transitory computer-readable medium 1032. The instructions 1030 may also reside, completely or at least partially, within the main memory 1008 and/or within the processor 1002 during their execution. The instructions 1030 may further be transmitted or received over the network 1026 via the modem 1022, such that the network 1026 includes computer-readable medium 1032.

Any of the circuits in the processor-based system 1000, and in particular the modem 1022 and the output devices 1020, may include multiple clock domains, each including a calibrated DPLL that includes a feedback circuit configured to calibrate a resolution of a TDC to a nominal resolution in a closed-loop method, to normalize responses in the DPLLs across multiple clock domains of the IC, as illustrated in FIGS. 3, 4A, and 4B.

While the computer-readable medium 1032 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or a computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields, particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A clamped phase interpolator, comprising:
a phase interpolator configured to generate an interpolator clock having a first phase in a first phase range based on a first interpolation code in a first range of interpolation codes; and
a clamping circuit configured to:
receive an indication of a reduced range of interpolation codes comprising less than all of the first range of interpolation codes, wherein the reduced range of interpolation codes corresponds to a reduced phase range comprising a portion of the first phase range;
receive a target phase clock having a target phase; and
provide, to the phase interpolator, the first interpolation code corresponding to the target phase in the reduced range of interpolation codes.

2. The clamped phase interpolator of claim 1, further configured to adjust the target phase clock relative to a first reference clock to adjust the target phase to be within the reduced phase range.

3. The clamped phase interpolator of claim 2, wherein the clamping circuit is further configured to adjust the target phase of the target phase clock based on a phase difference between the target phase and the interpolator phase.

4. The clamped phase interpolator of claim 2, wherein the reduced phase range is between a first reference phase of the first reference clock and a second reference phase of a second reference clock.

5. The clamped phase interpolator of claim 1, wherein a first portion of the reduced phase range is between a first reference phase of a first reference clock and a second reference phase of a second reference clock and a second portion of the reduced phase range is not between the first reference phase of the first reference clock and the second reference phase of the second reference clock.

6. The clamped phase interpolator of claim 2, wherein the clamping circuit is further configured to adjust a delay of a delay circuit configured to provide the target phase clock.

7. The clamped phase interpolator of claim 2, wherein the clamping circuit is further configured to adjust a delay of delay circuits configured to provide the first reference clock.

8. The clamped phase interpolator of claim 1, wherein the clamping circuit is further configured to adjust the first interpolation code based on a phase difference between the target phase and the interpolator phase.

9. The clamped phase interpolator of claim 2, wherein the clamping circuit is further configured to select, based on the target phase, the first reference clock from among a plurality of reference clocks at a first frequency.

10. The clamped phase interpolator of claim 1, wherein:
the first phase range extends from a minimum interpolation code to a first maximum interpolation code;
the indication of the reduced range of interpolation codes comprises a second maximum interpolation code less than the first maximum interpolation code; and
the reduced range of interpolation codes extends from the minimum interpolation code to the second maximum interpolation code.

11. The clamped phase interpolator of claim 10, the phase interpolator comprising:
a first phase interpolation circuit configured to generate a first interpolated clock having a second phase between a first reference phase of a first reference clock and a second reference phase of a second reference clock, wherein the first phase is based on the first interpolation code;
a second phase interpolation circuit configured to generate a second interpolated clock having a third phase between a third reference phase of a third reference clock and a fourth reference phase of a fourth reference clock based on a second interpolation code comprising a sum of the first interpolation code and a code offset; and
a summing circuit configured to generate the interpolator clock having the first phase between the second phase of the first interpolated clock and the third phase of the second interpolated clock.

12. The clamped phase interpolator of claim 11, wherein in response to the sum of the first interpolation code and the code offset being less than or equal to the second maximum interpolation code:
the second interpolation code comprises the sum;
the third reference clock comprises the first reference clock; and
the fourth reference clock comprises the second reference clock.

13. The clamped phase interpolator of claim 11, wherein in response to the sum of the first interpolation code and the code offset being more than the second maximum interpolation code:
the second interpolation code comprises the sum minus the first maximum interpolation code; and
the third reference clock comprises the second reference clock.

14. An integrated circuit (IC) comprising:
a sequential logic circuit configured to store data in response to a system clock;
a capture circuit configured to, in each cycle of the system clock, receive the data from the sequential logic circuit in response to an interpolator clock; and
a clamped phase interpolator, comprising:
a phase interpolator configured to generate the interpolator clock having a first phase in a first phase range based on a first interpolation code in a first range of interpolation codes; and
a clamping circuit configured to:
receive an indication of a reduced range of interpolation codes comprising less than all of the first range of interpolation codes, wherein the reduced range of interpolation codes corresponds to a reduced phase range comprising a portion of the first phase range;
receive a target phase clock having a target phase;
provide, to the phase interpolator, the first interpolation code corresponding to the target phase in the reduced range of interpolation codes.

15. The IC of claim 14, wherein the clamping circuit is further configured to adjust the target phase of the target phase clock relative to a first reference clock to be within the reduced phase range.

16. The IC of claim 15, wherein the clamping circuit is further configured to adjust a delay to change a timing of the first reference clock.

17. The IC of claim 14, wherein the clamping circuit is further configured to adjust the first interpolation code based on a phase difference between the target phase and the interpolator phase.

18. The IC of claim 14, wherein the clamping circuit is further configured to adjust the target phase of the target phase clock relative to a first reference clock and a second reference clock based on a phase difference between the target phase and the interpolator phase.

19. The IC of claim 15, wherein the clamping circuit is further configured to select, based on the target phase, the first reference clock from among a plurality of reference clocks.

20. The IC of claim 14, wherein:
the first range of interpolation codes extends from a minimum interpolation code to a first maximum interpolation code;
the indication of the reduced range of interpolation codes comprises a second maximum interpolation code in the first range of interpolation codes and less than the first maximum interpolation code; and
the reduced range of interpolation codes extends from the minimum interpolation code to the second maximum interpolation code.

21. A method in clamped phase interpolator, comprising:
generating an interpolator clock having an interpolator phase in a first phase range based on a first interpolation code in a first range of interpolation codes;
receiving a target phase clock having a target phase;
receiving an indication of a reduced range of interpolation codes comprising less than all of the first range of interpolation codes, wherein the reduced range of interpolation codes corresponds to a reduced phase range comprising a portion of the first phase range; and
providing the first interpolation code corresponding to the target phase in the reduced range of interpolation codes.

22. The method of claim 21, further comprising adjusting the target phase of the target phase clock relative to a first reference clock to adjust the target phase to be within the reduced phase range.

23. The method of claim 21, further comprising adjusting the first interpolation code based on a phase difference between the target phase and the interpolator phase.

24. The method of claim 22, further comprising adjusting the target phase of the target phase clock relative to the first reference clock based on a phase difference between the target phase and the interpolator phase.

25. The method of claim 21, wherein:
the first range of interpolation codes extends from a minimum interpolation code to a first maximum interpolation code;
the indication of the reduced range of interpolation codes comprises a second maximum interpolation code in the first range of interpolation codes and less than the first maximum interpolation code; and
the reduced range of interpolation codes extends from the minimum interpolation code to the second maximum interpolation code.

* * * * *